(12) United States Patent
Nesper et al.

(10) Patent No.: US 6,605,266 B2
(45) Date of Patent: Aug. 12, 2003

(54) USE AND PROCESS FOR PRODUCTION OF NANOTUBES

(75) Inventors: Reinhard Nesper, Kilchberg (CH); Michael Spahr, Zurich (CH); Markus Niederberger, Dallenwil (CH); Petra Bitterli, Wila (CH)

(73) Assignee: Eidg. Technische Hochschule Zurich, Zurich (CH)

( * ) Notice: Subject to any disclaimer, the term of this patent is extended or adjusted under 35 U.S.C. 154(b) by 232 days.

(21) Appl. No.: 09/764,077

(22) Filed: Jan. 19, 2001

(65) Prior Publication Data

US 2002/0127397 A1 Sep. 12, 2002

Related U.S. Application Data

(62) Division of application No. 09/331,243, filed on Aug. 4, 1999, now Pat. No. 6,210,800.

(30) Foreign Application Priority Data

Dec. 18, 1996 (CH) .............................................. 3106/96

(51) Int. Cl.$^7$ .............................................. C01G 31/02
(52) U.S. Cl. ........................ 423/592; 423/606; 423/659; 502/305; 502/353; 429/212; 429/217; 429/231.5; 210/638; 210/660; 219/744; 204/155
(58) Field of Search .................................. 423/592, 606, 423/659; 502/305, 353; 429/212, 217, 231.5; 210/638, 660; 219/744; 204/155

(56) References Cited

U.S. PATENT DOCUMENTS

| | | | |
|---|---|---|---|
| 5,659,034 A | 8/1997 | De Bord et al. | 546/2 |
| 5,695,734 A | 12/1997 | Ikazaki et al. | 423/461 |
| 5,717,120 A | 2/1998 | De Bord et al. | 556/28 |
| 5,853,877 A | 12/1998 | Shibuta | 428/367 |
| 5,965,267 A | 10/1999 | Nolan et al. | 428/408 |

FOREIGN PATENT DOCUMENTS

| | | |
|---|---|---|
| EP | 580 019 | 1/1994 |
| WO | WO 96/41043 | 12/1996 |

OTHER PUBLICATIONS

Kasuga et al, "Formation of Titanium Oxide Nanotube", Langmuir 14, pp 3160–3163, 1998.*
"Fullerene–Like Structures and Nanotubes From Inorganic Compounds" by Tenne, Endeavor 1996, pp 97–104 "Inorganic Fullergene of MX2" Mater. Res. Symposium Proc. (1995).
"Intercalation of Inorganic Fullerene–Like Structures Yields Photosensitive Films and New Tips for Scanning Probe Miscroscopy" by Homyonfer et al., Jour of Amer. Chem. Soc. 1997.
"Bulk Synthesis of Inorganic Fullerene–Like MS2 (M=Mo, W) from the Respective Trioxide and the Reaction Mechanism" by Feldman et al., J. Am. Chem. Soc. 1996.
"Carbon Nanoturbes as Removable Templates for Metal Oxide Nanocomposites and Nanostructures" by Ajayan et al., Nature, 1995.
"Oxid Nanotubes Prepared Using Carbon Nanotubes as Templates" by Satishkukar et al., J. Mater. Res. vol. 12, No. 3 Mar. 1997.
"Synthesis and Structure of Tochilinite: A Layered Metal Hydroxide/Sulfide Composite" by Kakos et al., J. Solid State Chemical, 1994.

* cited by examiner

Primary Examiner—Stuart L. Hendrickson
Assistant Examiner—Peter J. Lish
(74) Attorney, Agent, or Firm—Sughrue Mion, PLLC

(57) ABSTRACT

Separable nanotubes are made from a transition metal oxide, preferably from a vanadium oxide of variable valence. They show a greater oxidation resistance than the carbon-based nanotubes known so far and offer many new and economic applications. The inventive nanotubes clearly show oxidation-reduction activities and are particularly suited as an active material for catalytic reactions.

16 Claims, 5 Drawing Sheets

——— 0.5 μm

——— 210 nm

——— 0.1 μm

—— 50 nm

—— 50 nm

USE AND PROCESS FOR PRODUCTION OF NANOTUBES

This is a Divisional of application Ser. No. 09/331,243 filed Aug. 4, 1999 now U.S. Pat. No. 6,210,800, the disclosure of which is incorporated herein by reference.

BACKGROUND OF THE INVENTION

Nanotubes and the process for their production is known according to the current state-of-the-art. The nanotubes are needle-shaped tubes with a length of 1,000 Å, for example, and a diameter of a few 100 Å. Nanotubes are separated or separable and do not all point in one specific direction. Known are also sclerogenous structures, which are created by a network of tubes. The tubes of such a sponge-like structure have an inside diameter that is growth-limited to be not larger than 80 Å.

The currently known nanotubes and also the above-mentioned sclerogenous structures consist mainly of carbon and are produced by arcing. Reference is made to this in JP-A-071 65 406, JP-A-071 97 325 and in scientific discussions published in NATURE, volume 358, pages 220 through 222 and volume 363, pages 603 through 605. Known are also nanotubes made of gold or titanium oxide, as it can be seen in a publication of Langmuir, volume 12, number 6, 1996, pages 1411 through 1413.

Single nanotubes may be used, for example, to catch individual molecules. Nanotubes may be handled individually or they may be pasted on for microscopic examinations. However, carbon nanotubes have specifically the disadvantage that they are unstable relative to oxidizing effects.

SUMMARY OF THE INVENTION

The innovative nanotubes are characterized in that they are made of a transition metallic oxide. Such nanotubes may also be produced to be separable, whereby they are essentially not aligned in a three-dimensional manner. They are considerably more oxidation stable than carbon nanotubes and have additional advantageous characteristics and applications, which cannot be found in carbon nanotubes. In particular, the innovative nanotubes have distinct redox activities, which offer a number of novel uses and applications. It has been shown that nanotubes made of mixed-valence vanadium oxide are especially advantageous. They are especially oxidation stable and may be produced in form of a solution.

Innovative nanotubes and specifically nanotubes made from mixed-valence vanadium oxide are well suited as active agents for catalytic reactions. Special advantageous applications are the ones for the process of redox reaction in batteries as storage electrodes or in high capacity capacitors. Additonal advantageous uses of the innovative nanotubes may be seen in the process for exchange reactions of the tube content, which may include molecules, metallic clusters, metalloid clusters or polymers, and specifically so-called molecular wires. The nanotubes act in a size-selective manner so that proteins of a certain size may be placed into the tubes.

The invention, according to the minor claims, relates also to an advantageous process for the production and preferred use of nanotubes.

BRIEF DESCRIPTION OF THE DRAWINGS

Application examples of the invention are explained in more detail below. The enclosed illustrations show the following.

DETAILED DESCRIPTION OF THE INVENTION

The innovative nanotubes are arranged in multi-layered tube formations as shown in the electron-microscopic picture, whereby the individual tubes are open at both ends—but they could also be closed. The individual tubes are separable as already mentioned. The nanotubes are made of mixed-valence vanadium in their preferred version. They appear in form of black powder. The invention also includes nanotubes made of other transition metallic oxides, specifically vanadium oxide, molybdenum oxide, zinc oxide and indium oxide.

An example for the production of the innovative nanotubes made of vanadium oxide or molybdenum oxide is shown below. Vanadium is replaced by molybdenum in case of molybdenum oxide.

Vanadium oxide-triisopropoxide is added to 1.89 g (7.87 mmol) of hexadecylamine under argon atmosphere of 3.8 g (15.74 mmol) and it is then agitated for one hour by adding 5 ml of absolute ethanol. The created solution was later hydrolyzed, whereby orange precipitation occurred, which was aged during agitation for one day. This reaction mixture was then poured into an autoclave (43 ml volume) and was subsequently heated for one day to 80° C., the next day to 100° C. and for seven days to 180° C. The black reaction product was separated by filtering after cooling and was washed with 50 ml water, 50 ml ethanol and 20 ml ethyl ether and was subsequently dried in air.

Analytics:

[C] 38.47 weight percent [H] 7.72 weight percent [N] 2.72 weight percent

Hexadecylamine may be substituted with another neutral tenside molecule. Vanadium oxide-triisopropoxide may also be substituted with another metallic alkoxide, specifically with molybdenum oxide. The quantity ratio of the tenside molecule is of importance. Suitable ratio for quantity of substance is 1:2 and 1:3.

The hydrolysis of vanadium (V)-triisopropoxide in hexadecylamine solution resulted in a yellow lamellar structured composite made of a surfactant and vanadium (V)-oxide.

The even layer spaces in this material are approximately 3 nm. Subsequent treatment under hydrothermal condition create a product of isolated or star-shaped intergrown nanotubes with the empirical formula $VO_{2.4}$ $(C_{16}H_{33}NH_2)_{0.34}$.

Figure 1:
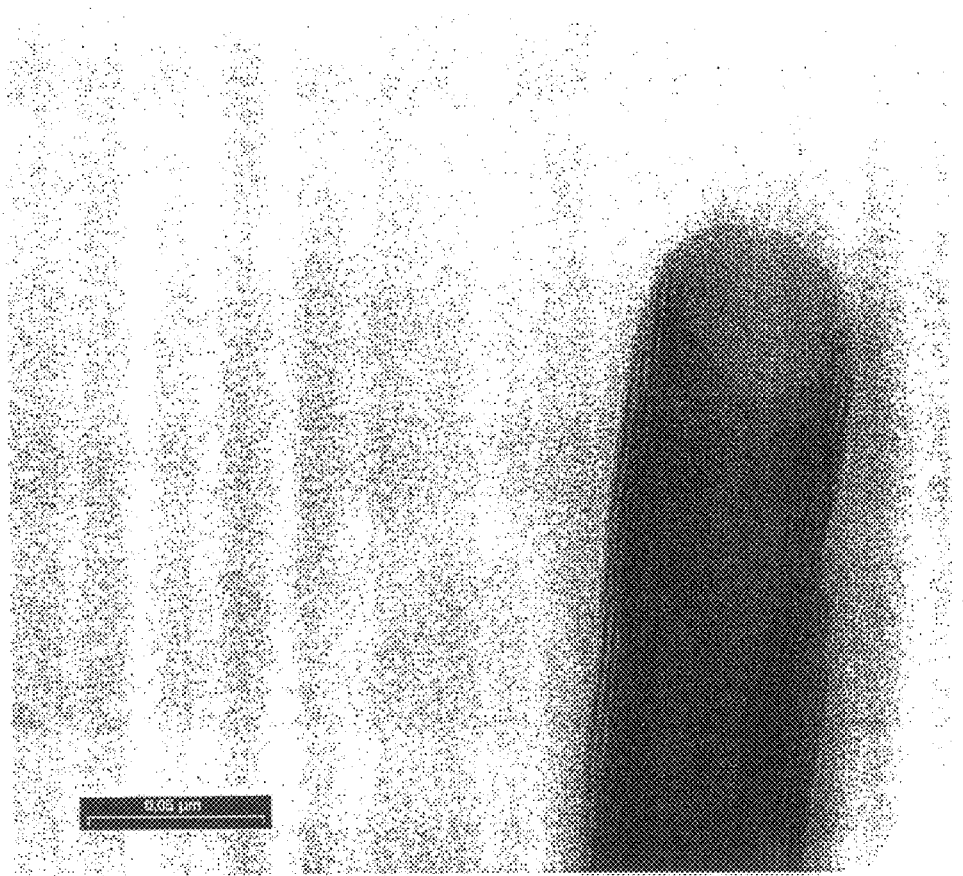
FIG. 1 shows and electron-microscopic partial view of a nanotube.
Figure 2:
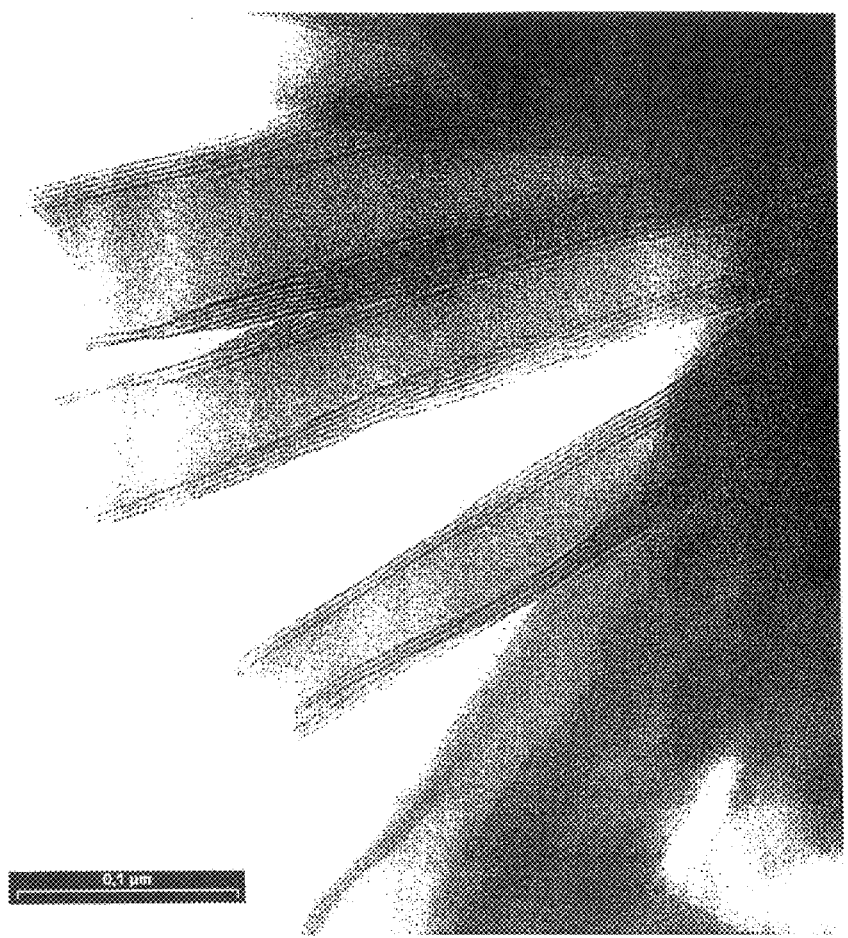
FIG. 2 shows an electron-microscopic view of a group of nanotubes.
Figure 3A:
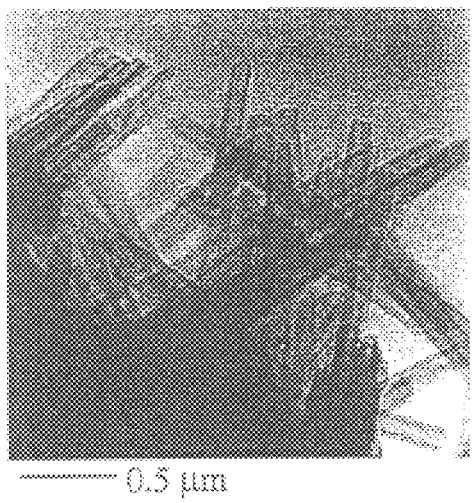
FIG. 3a shows a scanning electron-microscopic view of open vanadium oxide nanotubes with a length of up to 2,000 nm.
Figure 3B:
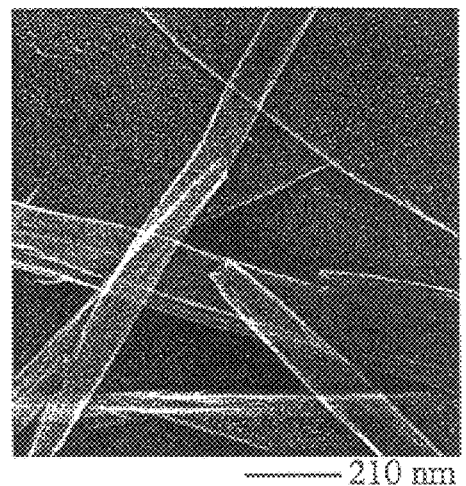
FIG. 3b shows an EM picture of low definition, which also shows that isolated or intergrown vanadium oxide nanotubes are created as the main product after hydrothermal analysis.
Figure 3C:
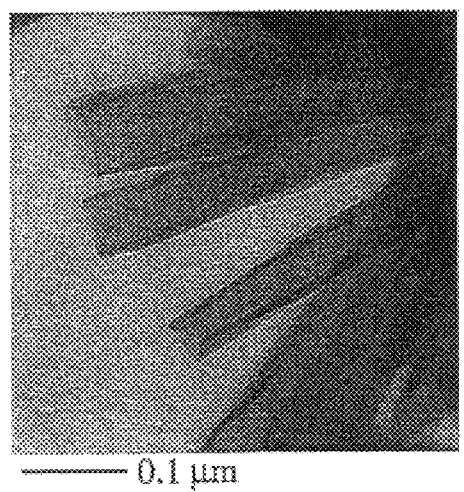
FIGS. 3c and 3d show a high-definition TEM picture, whereby a space of approximately 3 nm between layers may be clearly observed according to the multi-layer characteristic of the oxidized walls. The free diameter of the illustrated tubes are between approximately 25 and 35 nm and the outer measurements are between 50 and 70 nm.
Figure 3D:
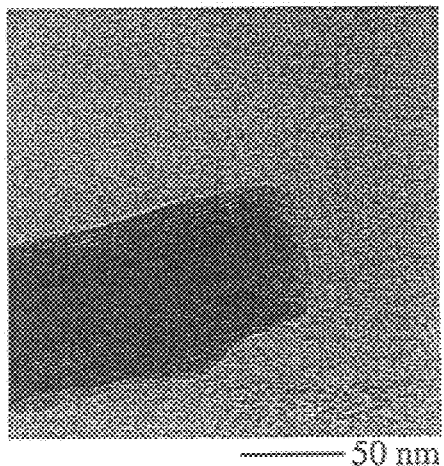
Figure 3E:
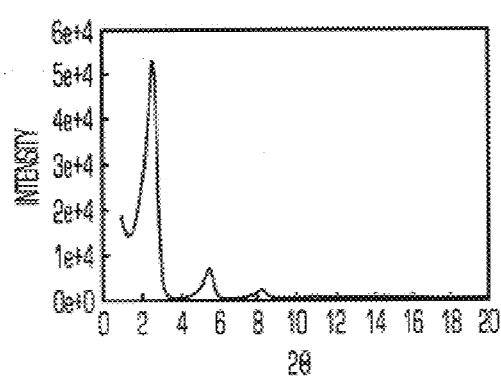
FIG. 3e shows an X-ray diffraction diagram of a powder test of an innovative vanadium oxide nanotube, whereby the reflex of highest intensity has a value of approximately 3.3 nm, which corresponds to the layer space in the TEM picture.
Figure 3F:
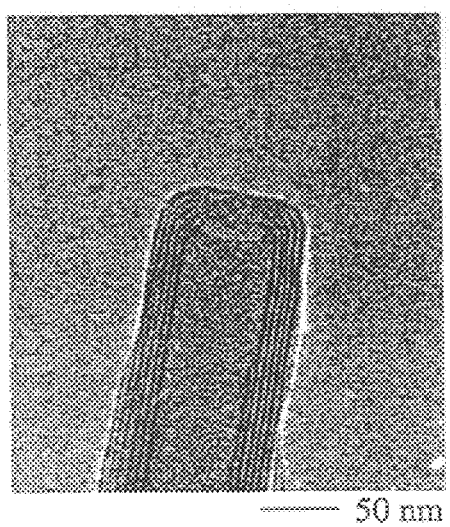
FIG. 3f shows a picture of nanotubes with closed ends, whereby the ratio of alkoxide to template (Templat) is 1:1.

The black powdery material is paramagnetic and has semi-metallic electronic conduction characteristics, which is based on the mixed-valence vanadium centers. The electron-microscopic pictures show almost exclusively isolate or star-shaped intergrown nanotubes (FIG. 3a) having a length of up to 2,000 nm. The cylindrical open ends of the tubes are easily seen through the scanning electron microscope (FIG. 3b). Highly defined TEM pictures (FIGS. 3c and 3d) show that the tubes have diameters between 15 and 100 nm and tunnel openings between 5 and 50 nm. In addition, the walls consist of concentric shells with a thickness of approximately 3 nm. That corresponds exactly to the strongest X-ray reflex in the powder diagram (FIG. 3e). This product is identified here with ETH1, following the common practice for zeolitic and mesoporous materials. Tubes with closed ends may also be obtained under slightly changed synthesis conditions (see FIG. 3f).

Figure 4:
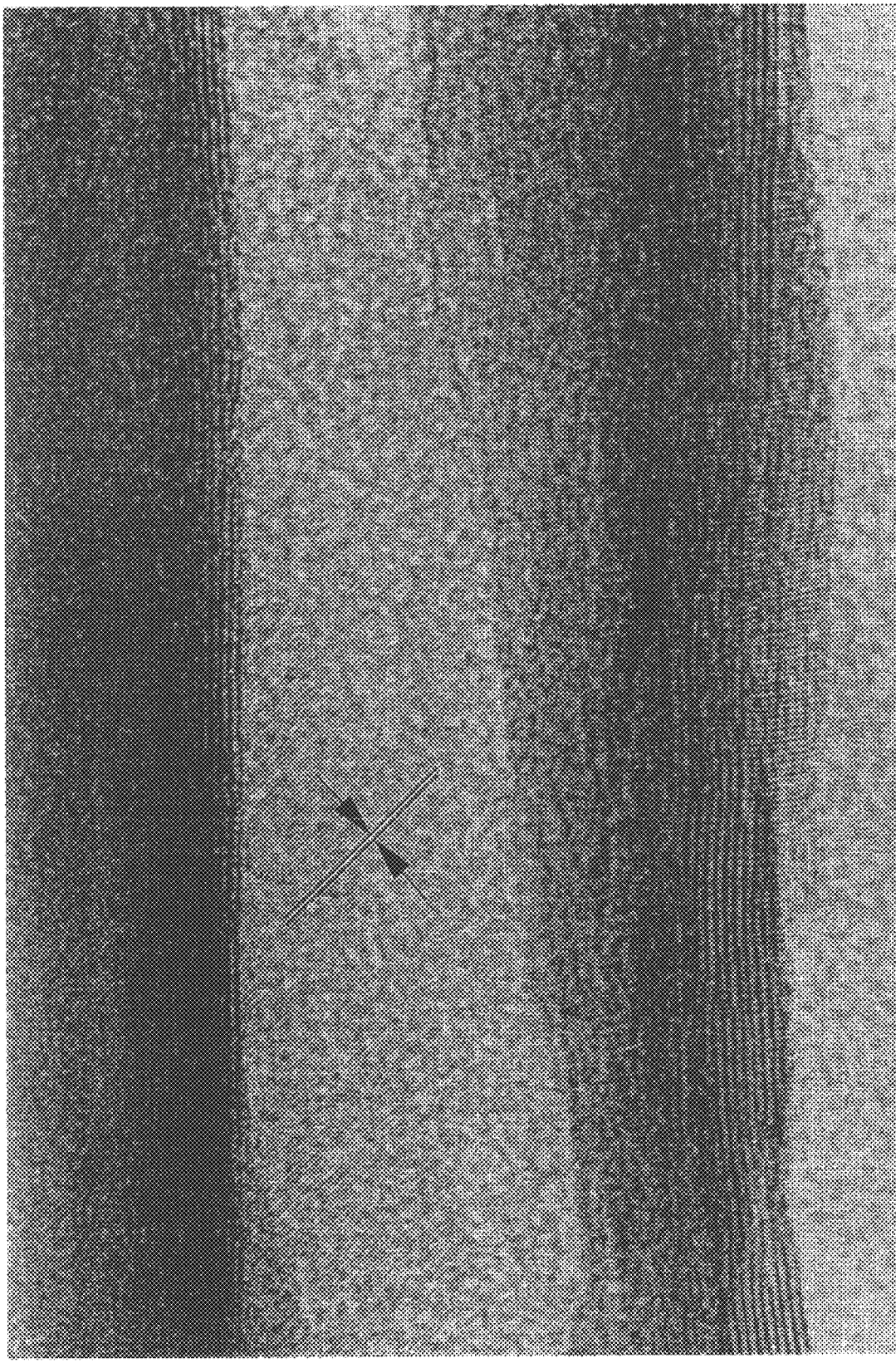
FIG. 4 shows a high-definition TEM picture of a cation-exchanged nanotube, where the layer contrasts show only a space of 0.86 nm according to the arrow markings and where some areas show a fine structure, which suggests a systematic structure in the individual wall layers and between the layers.

Fascinating is the observation that the spaces between the layers in the tube walls become smaller after detemplatization (ETH2, FIG. 4) from ETH1 (approximately 2.8 to 3.0 nm) to approximately 0.86 nm (FIG. 4, arrow markings). A cooperative process must be assumed since most tubes remain in existence during this reaction. It is interesting that the crystallinity of the exchanged product is considerably better than the one of ETH1. In some cases, smaller contrast spaces of approximately 0.65 nm may be observed on the tube surfaces, which indicate a crystalline order within the wall layers and in between the layers (FIG. 4, arrow markings). This may also be interpreted as the considerably higher thermal capacity of the tubes in the electron beam. The exchanged and structural altered material is here identified as ETH2.

In contrast to the much smaller carbon nanotubes, the $VO_2$-tubes are obtained as the main product of a direct chemical synthesis at relative low temperatures. Compared to other oxidic mesoporous substances, like MCM41 or MCM49, there are no condensing ring systems in this case and the tunnel diameters are greater up to a factor of 10. Besides, no multi-layered walls were observed in MCM-materials, which could be a reason that intermediate created and isolated aluminosilicate tubes have not been detected up to now. The innovative nanotubes offer fascinating possibilities for further chemical and physical exploration of nano-size structures and they could be a fruitful stimulant for potential applications. Especially the general cooperative cation exchange between the layers offers a number of experiments in regard of an insertion of functional cations or cation systems. Even though the size of the tubes may be of interest in relation to a large material surface, we believe that the tubes may be used above all for the absorption of large functional molecules and for the combination of inorganic materials, to include polymeric organic or even biological substances. It is also important that the multi-layered material of the nanotubes may also have template molecules in the intermediate layers, which may be removed by a simple cation exchange whereby the tubes may still be retained. We claim:

What is claimed is:

1. A process for the production of nanotubes comprising transition metallic oxide comprising the following process steps:
   production of a solution from a neutral tenside molecule and one transition metallic alkoxide,
   hydrolyzation of the solution and aging of a precipitation,
   heating of the precipitation,
   wherein the neutral tenside molecule is hexadecylamine.

2. A process for the production of nanotubes comprising metallic oxide comprising the following process steps:
   production of a solution from a neutral tenside molecule and one transition metallic alkoxide,
   hydrolyzation of the solution and aging of a precipitation,
   heating of the precipitation,
   wherein the transition metallic alkoxide is a vanadium alkoxide or molybdenum alkoxide.

3. A process for the production of nanotubes comprising transition metallic oxide comprising the following process steps:
   production of a solution from a neutral tenside molecule and one transition metallic alkoxide,
   hydrolyzation of the solution and aging of a precipitation,
   heating of the precipitation,
   wherein the precipitation is heated in stages at a temperature range of approximately 70° C. to 190° C.

4. A process according to claim 3, wherein the precipitation is heated to approximately 80° C., then to approximately 100° C. and finally to approximately 180° C.

5. A process according to claim 4, wherein each temperature is maintained for a number of hours.

6. A process according to claim 5, wherein the highest temperature is maintained for a number of days.

7. A process for the production of nanotubes comprising transition metallic oxide comprising the following process steps:
   production of a solution from a neutral tenside molecule and one transition metallic alkoxide,
   hydrolyzation of the solution and aging of a precipitation,
   heating of the precipitation,
   wherein the nanotubes have intermediate layers containing template molecules, and the template molecules in the intermediate layers are removed by cation exchange.

8. A process according to claim 2, wherein the transition metallic alkoxide is vanadium oxide-triisopropoxide or molybdenum oxide-triisopropoxide.

9. A process for the production of nanotubes comprising transition metallic oxide comprising the following process steps:
   production of a solution from a neutral tenside molecule and one transition metallic alkoxide,
   hydrolyzation of the solution and aging of a precipitation,
   heating of the precipitation,
   wherein the precipitation is aged about 24 hours.

10. A process according to claim 5, wherein each temperature is maintained for at least one day.

11. A process according to claim 6, wherein the highest temperature is maintained for approximately seven days.

12. A process of catalyzing comprising carrying out catalytic reactions with nanotubes comprising a mixed valence vanadium oxide.

13. A process of redox reactions in high capacity capacitors comprising carrying out redox reactions in high capacity capacitors with nanotubes comprising a mixed valence vanadium oxide.

14. A process of redox reactions in batteries comprising carrying out redox reactions in batteries with nanotubes comprising a mixed valence vanadium oxide.

15. The process according to claim 14, wherein the nanotubes are used in a storage electrode.

16. A process of exchange reaction, comprising carrying out an exchange reaction with nanotubes comprising a mixed valence vanadium oxide, wherein the reaction is an ion exchange, an absorption of electromagnetic waves or an electric excitation reaction.

* * * * *

UNITED STATES PATENT AND TRADEMARK OFFICE
CERTIFICATE OF CORRECTION

PATENT NO. : 6,605,266 B2  
DATED : August 12, 2003  
INVENTOR(S) : Nesper et al.

It is certified that error appears in the above-identified patent and that said Letters Patent is hereby corrected as shown below:

Title page,
Item [63], Related U.S. Application Data, please amend as follows:
  Division of application No. 09/331,243, filed on Aug. 4, 1999, now Pat. No. 6,210,800, which is a National Stage of International Application No. PCT/CH97/00470, filed December 17, 1997.

Column 1,
Line 6, insert the following, -- which is a National Stage of International Application No. PCT/CH97/00470, filed December 17, 1997 --

Signed and Sealed this

Sixth Day of July, 2004

JON W. DUDAS
*Acting Director of the United States Patent and Trademark Office*